_(12)_ United States Patent
Kuloor et al.

(10) Patent No.: US 10,908,198 B2
(45) Date of Patent: Feb. 2, 2021

(54) DETERMINING METER PHASE USING INTERVAL VOLTAGE MEASUREMENTS

(71) Applicant: LANDIS+GYR INNOVATIONS, INC., Alpharetta, GA (US)

(72) Inventors: Soorya Kuloor, Cary, NC (US); Kelvin Proctor, Orange (AU); Chethana Kuloor, Cary, NC (US); Sravan Buggaveeti, Morrisville, NC (US); Jack Dangar, Glebe (AU)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 101 days.

(21) Appl. No.: 16/055,713

(22) Filed: Aug. 6, 2018

(65) Prior Publication Data

US 2019/0041436 A1 Feb. 7, 2019

Related U.S. Application Data

(60) Provisional application No. 62/541,934, filed on Aug. 7, 2017.

(51) Int. Cl.
*G01R 21/133* (2006.01)
*G01R 22/06* (2006.01)
(Continued)

(52) U.S. Cl.
CPC ..... *G01R 21/1331* (2013.01); *G01R 19/2513* (2013.01); *G01R 22/063* (2013.01);
(Continued)

(58) Field of Classification Search
USPC .............................................. 324/142, 73.1
See application file for complete search history.

(56) References Cited

U.S. PATENT DOCUMENTS

| 6,615,147 B1 | 9/2003 | Jonker et al. |
| 6,816,360 B2 | 11/2004 | Brooksby et al. |

(Continued)

FOREIGN PATENT DOCUMENTS

| WO | 2018072030 | 4/2018 |
| WO | 2018083902 | 5/2018 |
| WO | 2019026791 | 2/2019 |

OTHER PUBLICATIONS

Arya et al., "Phase Identification in Smart Grids", IEEE International Conference on Smart Grid Communications (SmartGridComm), Brussels, 2011, pp. 25-30.

(Continued)

*Primary Examiner* — Vincent Q Nguyen
(74) *Attorney, Agent, or Firm* — Kilpatrick Townsend & Stockton LLP

(57) ABSTRACT

A method for determining the phase of an electric meter includes: selecting a population of electric meters; selecting a historical time range based at least in part on the selected population of electric meters; selecting an interval period; creating profiles for each electric meter in the selected population of electric meters based on the voltage measurements over one or more interval periods; calculating a correlation coefficient matrix based on the profiles; clustering the selected population of electric meters into a plurality of clusters; and determining a phase of each cluster of the plurality of clusters.

20 Claims, 5 Drawing Sheets

(51) Int. Cl.
*G06Q 50/06* (2012.01)
*G01R 19/25* (2006.01)
*G01R 31/67* (2020.01)
*G01D 4/00* (2006.01)

(52) U.S. Cl.
CPC .............. *G01R 31/67* (2020.01); *G06Q 50/06* (2013.01); *G01D 4/004* (2013.01)

(56) References Cited

U.S. PATENT DOCUMENTS

| | | | |
|---|---|---|---|
| 7,135,850 B2 | 11/2006 | Ramirez | |
| 7,469,190 B2 | 12/2008 | Bickel | |
| 7,693,670 B2 | 4/2010 | Durling et al. | |
| 7,990,806 B2 | 8/2011 | Chen | |
| 8,004,933 B2 | 8/2011 | Iseli | |
| 8,121,741 B2 | 2/2012 | Taft et al. | |
| 8,223,466 B2 | 7/2012 | Roscoe | |
| 8,322,215 B2 | 12/2012 | Lakich et al. | |
| 8,326,554 B2 | 12/2012 | Caird | |
| 8,635,036 B2 | 1/2014 | Pamulaparthy et al. | |
| 8,754,634 B2 | 6/2014 | Chamarti et al. | |
| 8,830,083 B2 | 9/2014 | LaFrance et al. | |
| 8,854,217 B2 | 10/2014 | Brown et al. | |
| 8,947,246 B2 | 2/2015 | Aiken | |
| 8,978,443 B2 | 3/2015 | Ramirez | |
| 8,996,144 B2 | 3/2015 | LaFrance et al. | |
| 9,164,135 B2 | 10/2015 | Cs et al. | |
| 9,304,014 B2 | 4/2016 | Komati et al. | |
| 9,341,686 B2 | 5/2016 | Deak et al. | |
| 9,476,740 B2 | 10/2016 | Zigovszki et al. | |
| 9,557,392 B2 | 1/2017 | Schuhl et al. | |
| 9,568,522 B2 | 2/2017 | Aiello et al. | |
| 9,602,895 B2 | 3/2017 | Bowling et al. | |
| 9,671,254 B2 | 6/2017 | Zigovszki et al. | |
| 9,887,051 B2 | 2/2018 | LaFrance et al. | |
| 9,891,088 B2 | 2/2018 | Zigovszki et al. | |
| 10,240,961 B2 | 3/2019 | Cheng et al. | |
| 10,254,315 B2 | 4/2019 | Higashi et al. | |
| 10,295,578 B2 | 5/2019 | Higashi et al. | |
| 2012/0182157 A1* | 7/2012 | Carr .......................... | H04O 9/00 340/870.02 |
| 2014/0005853 A1* | 1/2014 | Chen ....................... | G01R 22/10 700/298 |
| 2015/0052088 A1 | 2/2015 | Arya et al. | |
| 2015/0241482 A1 | 8/2015 | Sonderegger | |
| 2018/0073910 A1 | 3/2018 | Deak et al. | |
| 2018/0106640 A1 | 4/2018 | Padrones et al. | |
| 2019/0041439 A1 | 2/2019 | Brown | |
| 2019/0041445 A1 | 2/2019 | Kuloor et al. | |
| 2019/0094329 A1 | 3/2019 | Minich | |
| 2019/0101411 A1 | 4/2019 | Davis et al. | |
| 2019/0129368 A1* | 5/2019 | Iacovella ................ | G06Q 10/04 |
| 2019/0219618 A1 | 7/2019 | Davis et al. | |

OTHER PUBLICATIONS

Byun et al., "Cable and Phase Identification based on Power Line Communication", International Journal of Control and Automation, vol. B, No. 9, 2015, pp. 63-74.

Power Systems Integrity, Inc., "Live Line Phase Identification—Phase ID 6000", available online at http://www.psinteg.com/Phase_ID.html at least as early as Feb. 2020, 2 pages.

U.S. Appl. No. 16/057,178, Non-Final Office Action dated Jul. 13, 2020, 13 pages.

Short, "Advanced Metering for Phase Identification, Transformer Identification, and Secondary Modeling", IEEE Transactions on Smart Grid, vol. 4, No. 2, Jun. 2013, pp. 651-658.

* cited by examiner

600

Meter #

| | 1 | 2 | 3 | 4 | 5 |
|---|---|---|---|---|---|
| 1 | 1.0000 | | | | |
| 2 | 0.3850 | 1.0000 | | | |
| 3 | 0.9525 | 0.3764 | 1.0000 | | |
| 4 | 0.9565 | 0.3975 | 0.9935 | 1.0000 | |
| 5 | 0.9547 | 0.3971 | 0.9909 | 0.9923 | 1.0000 |
| | 1 | 2 | 3 | 4 | 5 |

Meter #

FIG. 6

DETERMINING METER PHASE USING INTERVAL VOLTAGE MEASUREMENTS

CROSS-REFERENCES TO RELATED APPLICATIONS

This application claims the benefit of U.S. Provisional Application No. 62/541,934, filed Aug. 7, 2017, the disclosure of which is hereby incorporated in its entirety by reference.

BACKGROUND

Unless otherwise indicated herein, the materials described in this section are not prior art to the claims in this application and are not admitted to be prior art by inclusion in this section.

Utility companies typically manually track electric meters installed in the field as well as the connectivity of the electric meters to distribution transformers. For large utility companies the number of electric meters can be upwards of a few million with distribution transformers being close to one million. Geographic Information Systems (GIS) can be used to track the phase designations for the electric meters. However, GIS are not very accurate. In addition, the actual phase designation of the electric meters and associated upstream assets may change from time to time due to work performed by line crews on the system assets. Similar problems may also exist in 3-phase distribution transformers with multiple electric meters connected to them. The phase of an individual electric meter is typically not recorded but needs to be determined for purposes of managing loading on a power grid.

SUMMARY

Methods and systems for determining the phase of an electric meter using interval voltage measurements are provided.

According to various aspects there is provided a method for determining the phase of an electric meter. In some aspects, the method may include: selecting a population of electric meters; selecting a historical time range based at least in part on the selected population of electric meters; selecting an interval period; creating profiles for each electric meter in the selected population of electric meters based on the voltage measurements over one or more interval periods; calculating a correlation coefficient matrix based on the profiles; clustering the selected population of electric meters into a plurality of clusters; and determining a phase of each cluster of the plurality of clusters.

The population of electric meters may be selected as a plurality of electric meters connected to a common voltage source, where the common voltage source may be a specified distribution transformer or feeder circuit. The profiles created for each electric meter may be voltage profiles or voltage change profiles.

The clustering may include associating each electric meter with more than one cluster. Confidence factors may be calculated for each electric meter in the selected population, where the confidence factors may indicate a level of confidence that an electric meter belongs in each cluster with which it is associated.

One cluster of the plurality of clusters for which each electric meter has a highest confidence factor may be determined, and each electric meter may be allocated to the cluster for which the electric meter has the highest confidence factor. A phase code of an electric meter having a highest confidence factor in the cluster may be determined, and the phase code assigned to each electric meter allocated to the cluster.

According to various aspects there is provided a system for determining the phase of an electric meter. In some aspects, the system may include: an electric meter; a storage device; and a head-end controller configured to communicate with the storage device and the electric meter.

The head-end controller may be configured to: select a population of electric meters; select a historical time range based at least in part on the selected population of electric meters; select an interval period; measure voltage during a plurality of interval periods for each electric meter in the selected population of electric meters; create profiles for each electric meter in the selected population of electric meters based on the voltage measurements over one or more interval periods; calculate a correlation coefficient matrix based on the profiles; cluster the selected population of electric meters into a plurality of clusters; and determine a phase of each cluster of the plurality of clusters.

The head-end controller may be configured to select the population of electric meters as a plurality of electric meters connected to a common voltage source, where the common voltage source may be a specified distribution transformer or feeder circuit. The profiles created for each electric meter may be voltage profiles or voltage change profiles.

The head-end controller may be configured to associate each electric meter with more than one cluster, and calculate confidence factors for each electric meter in the selected population. The confidence factors may indicate a level of confidence that an electric meter belongs in each cluster with which it is associated.

The head-end controller may also be configured to determine one cluster of the plurality of clusters for which each electric meter has a highest confidence factor, and to allocate each electric meter to the cluster for which the electric meter has the highest confidence factor. The head-end controller may be configured to determine a phase code of an electric meter having a highest confidence factor in the cluster, and assign the phase code to each electric meter allocated to the cluster.

Numerous benefits are achieved by way of the various embodiments over conventional techniques. For example, the various embodiments provide methods and systems that can be used to identify a number of electric meters and their associated electrical loads connected to various phases of a 3-phase power grid. In some embodiments, voltage measurements over specified time intervals may be correlated with a sensor having a known phase to determine the phase of a cluster of electric meters. If the phase of a device associated with a sensor is known, then the voltages associated with the device can be used to create a profile and the profile compared to the profiles for the electric meters. These and other embodiments along with many of its advantages and features are described in more detail in conjunction with the text below and attached figures.

BRIEF DESCRIPTION OF THE DRAWINGS

Aspects and features of the various embodiments will be more apparent by describing examples with reference to the accompanying drawings, in which:

FIG. 6 is an example of a correlation coefficient matrix according to various aspects of the present disclosure.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Figure 1:
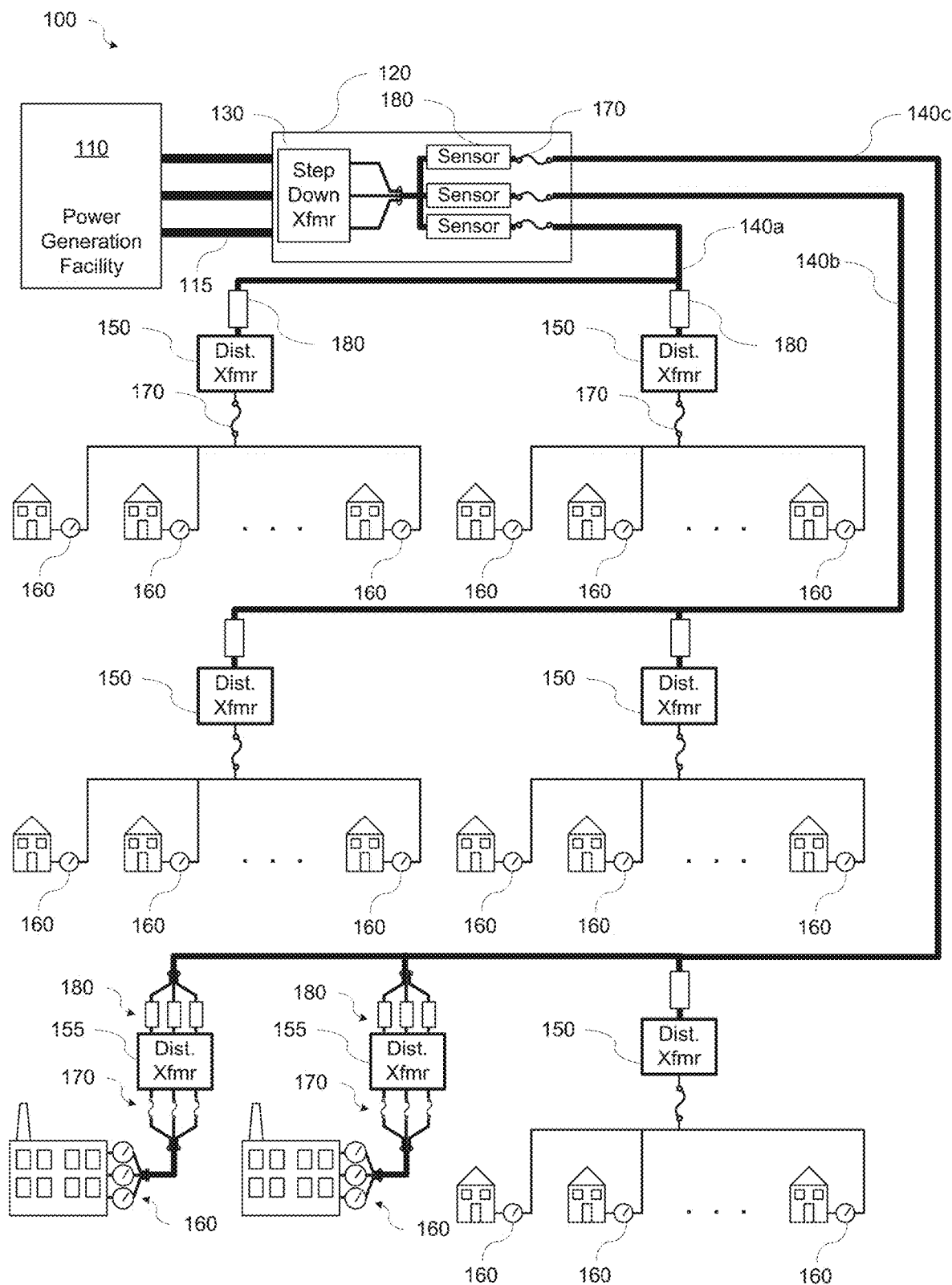
FIG. 1 is a block diagram illustrating an electrical power distribution system according to various aspects of the present disclosure.

In accordance with various aspects of the present disclosure, a method determines electric meter phase by clustering electric meter voltage measurements. The method is well suited to automation and refinement using machine learning. Accordingly, the method may be applied to large utility systems. FIG. 1 is a block diagram illustrating an electrical power distribution system 100 according to various aspects of the present disclosure. Referring to FIG. 1, an electrical power generation facility 110 may generate electrical power. The generated electrical power may be, for example, 3-phase alternating current (AC) power. In a three-phase power supply system, three conductors each carry an alternating current of the same frequency and voltage amplitude relative to a common reference, but with a phase difference of one third of a cycle between each. The electrical power may be transmitted at high voltage (e.g., ~140-750 kV) via transmission lines 115 to an electrical power substation 120.

At the electrical power substation 120 a step-down transformer 130 may step down the high voltage power to a voltage level more suitable for customer usage. The stepped down 3-phase power may be transmitted via feeders 140a, 140b, 140c to distribution transformers 150 which may further step down the voltage (e.g., 120-240V for residential customers). Each distribution transformer 150, 155 may deliver single phase and/or 3-phase power to residential and/or commercial customers. From the distribution transformers 150, 155, electrical power is delivered to the customers through electric meters 160. The electric meters 160 may be supplied by the power utility company and may be connected between the loads (i.e., the customer premises) and the distribution transformers 150, 155. Three-phase transformers 155 may deliver 3-phase power, for example, to commercial customers. In addition to 3-phase power, single phase power may be delivered from the distribution transformers 150 to various customers from different phases of the 3-phase power generated by the utility company resulting in uneven loading on the phases.

Fuses 170 and sensors 180 may be distributed throughout the network at various assets, for example, but not limited to, feeder circuits, distribution transformers, etc. The fuses 170 may interrupt the circuit in the case of a circuit fault (e.g., a short circuit). One of ordinary skill in the art will appreciate that other types of circuit interruption devices, for example, but not limited to circuit breakers, reclosers, etc., may be used without departing from the scope of the present disclosure. The sensors 180 may sense various circuit parameters, for example, frequency, voltage, current magnitude, and phase angle, to monitor operation of the network. One of ordinary skill in the art will appreciate that the illustrated locations of the sensors and fuses are merely exemplary and that sensors and/or fuses may be disposed at other locations and that additional or fewer sensors and/or fuses may be used without departing from the scope of the present disclosure.

Figure 2:
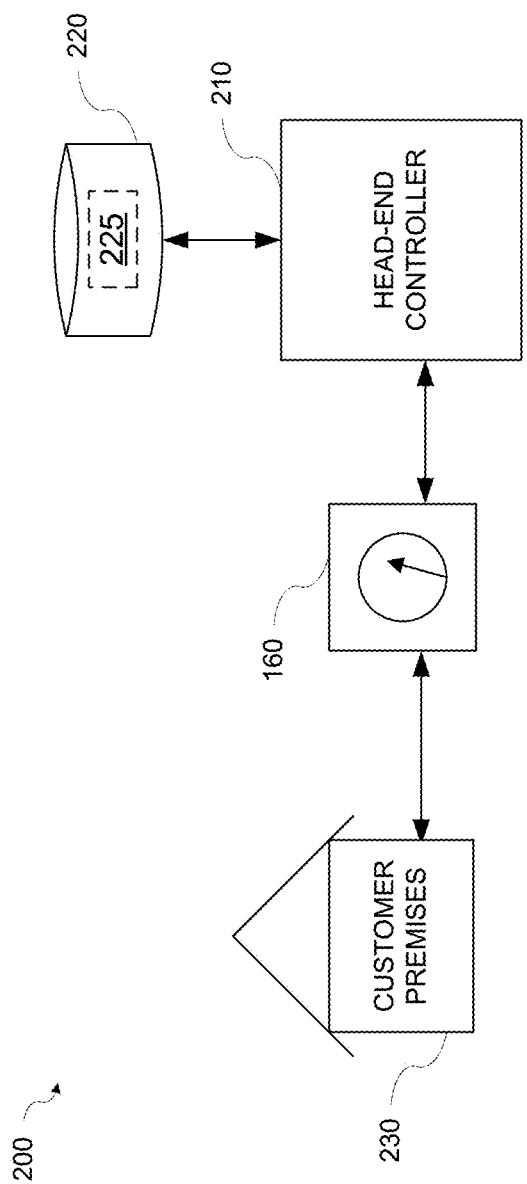
FIG. 2 is diagram illustrating a utility management system according to various aspects of the present disclosure.

FIG. 2 is a diagram illustrating a utility management system 200 according to various aspects of the present disclosure. Referring to FIG. 2, the utility management system 200 may include an electric meter 160, a head-end controller 210, and a storage device 220. While FIG. 2 illustrates one electric meter 160 for ease of explanation, one of ordinary skill in the art will appreciate that a plurality of electric meters 160 may be included in the disclosed utility management system 200 without departing from the scope of the present disclosure.

The electric meter 160 may monitor and/or record the energy usage at the customer premises 230 and communicate the information about energy usage to the head-end controller 210. For example, the electric meter 160 may continually monitor and record total energy usage at the customer premises 230. In accordance with various aspects of the present disclosure, the electric meter 160 may monitor and/or record days of the week and times of the day related to energy usage at the customer premises 230 and communicate the information to the head-end controller 210. In addition, the electric meter 160 may perform as a sensor to detect and/or record abnormal measurements and/or events. One of ordinary skill in the art will appreciate that other information, for example, but not limited to, average power consumed, peak power, etc., may be monitored and communicated by the electric meter 160.

The electric meter 160 may communicate with the head-end controller 210 via wired or wireless communication interfaces known to those of skill in the art using communication protocols appropriate to the specific communication interface. Different wired or wireless communication interfaces and associated communication protocols may be implemented on the electric meter 160 for communication with the head-end controller 210. For example, in some embodiments a wired communication interface may be implemented, while in other embodiments a wireless communication interface may be implemented for communication between the electric meter 160 and the head-end controller 210. In some embodiments, a wireless mesh network may connect the electric meters 160. The electric meters 160 may transmit data to a collector (not shown) that communicates with another network to transmit the data to the head-end controller 210. The electric meters 160 may use radio frequency (RF), cellular, or power line communication to communicate. One of ordinary skill in the art will appreciate that other communication methods may be used without departing from the scope of the present disclosure.

Figure 3:
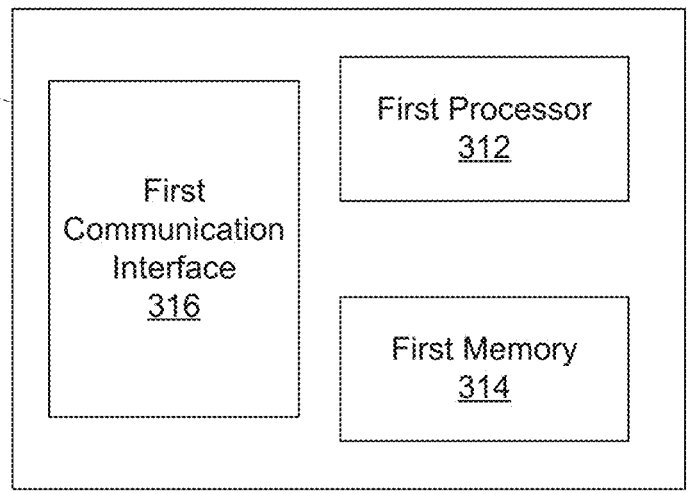
FIG. 3 is a block diagram illustrating a head-end controller according to various aspects of the present disclosure.

FIG. 3 is a block diagram 300 illustrating a head-end controller 210 according to various aspects of the present disclosure. Referring to FIG. 3, the head-end controller 210 may control overall operation of the utility management system 200. The head-end controller 210 may include a first processor 312, a first memory 314, and a first communications interface 316.

The first processor 312 may be a microprocessor; however, embodiments in accordance with the present disclosure are not limited to this implementation. For example, the first processor 312 may be a microprocessor, microcomputer, computer, microcontroller, programmable controller, or other programmable device. One of ordinary skill in the art will appreciate that other variations may be implemented without departing from the scope of the present disclosure. The first memory 314 may be, for example, but not limited to, one or more solid state memory devices or other memory devices. The first memory 314 may store data and instructions for operation and control of the utility management system 200.

The head-end controller 210 may communicate with the electric meter 160 and the storage device 220 via the first communications interface 316. Different wired or wireless communication interfaces and associated communication protocols may be implemented by the first communication interface 316 on the head-end controller 210 for communication with different devices. For example, a wired communication interface may be implemented between the head-end controller 210 and the storage device 220, while a wireless communication interface may be implemented for communication between the head-end controller 210 and the electric meter 160. In some embodiments, the electric meter 160 may communicate with the head-end controller 210 via the internet or via a local gateway. One of ordinary skill in the art will appreciate that other communications configurations may be used without departing from the scope of the present disclosure.

The storage device 220 may be, for example, but not limited to, one or more hard-disk drives, solid-state memory devices, or other computer-readable storage media. One of ordinary skill in the art will appreciate that other storage configurations may be used without departing from the scope of the present disclosure. A database 225 may be stored on the storage device 220.

The database 225 may include data related to the number of electric meters connected to each feeder, the number of electric meters connected to each distribution transformer, the type of meter for each electric meter, the models of the electric meters, geographical locations of the electric meters, or geospatial locations of the electric meters, etc., for a plurality of electric meters in the utility management system 200. For example, the database 225 may include days of the week and times of the day correlating with load is operating information, for example, but not limited to, average power consumed by the load, peak power consumed by the load, etc. One of ordinary skill in the art will appreciate that this information is exemplary and that other information may be included in the database 225 without departing from the scope of the present disclosure.

Figure 4:
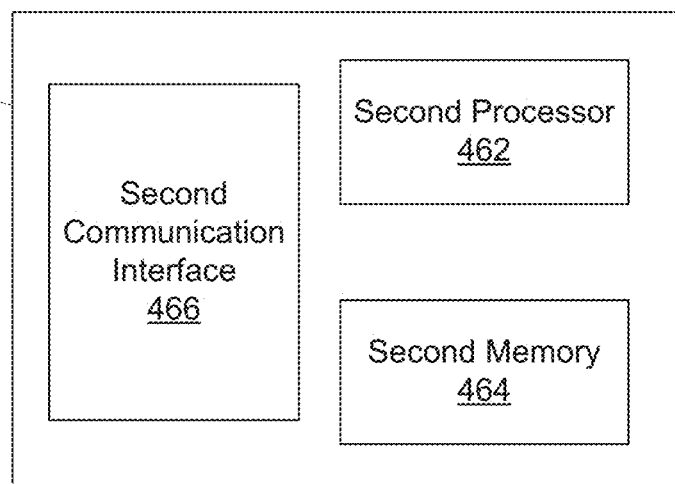
FIG. 4 is a block diagram illustrating an electric meter according to various aspects of the present disclosure.

FIG. 4 is a block diagram 400 illustrating an electric meter 160 according to various aspects of the present disclosure. Referring to FIG. 4, the electric meter 160 may include a second processor 462, a second memory 464, and a second communications interface 466. The electric meter 160 may monitor the load (i.e., the customer premises 230) and usage data of the load to the head-end controller 210. For example, the electric meter 460 may monitor the load and transmit via the second communications interface 466 the usage data of the load and/or other information to the head-end controller 210.

The second processor 462 may be a microprocessor; however, embodiments in accordance with the present disclosure are not limited to this implementation. For example, the second processor 462 may be a microprocessor, microcomputer, computer, microcontroller, programmable controller, or other programmable device. One of ordinary skill in the art will appreciate that other variations may be implemented without departing from the scope of the present disclosure. The second memory 464 may be, for example, but not limited to, one or more solid state memory devices or other memory devices. The second memory 464 may store data related to operation of the load.

The electric meter 160 may communicate with the head-end controller 210 and the customer premises 230 via the second communications interface 166. Different wired or wireless communication interfaces and associated communication protocols may be implemented by the second communication interface 166 on the electric meter 160 for communication with different devices. For example, a wired communication interface may be implemented between the electric meter 160 and the customer premises 230, while a wireless communication interface may be implemented for communication between the electric meter 160 and the head-end controller 210. In some embodiments, the electric meter 160 may communicate with the head-end controller 210 via the internet or via a local gateway. One of ordinary skill in the art will appreciate that other communications configurations may be used without departing from the scope of the present disclosure.

Figure 5:
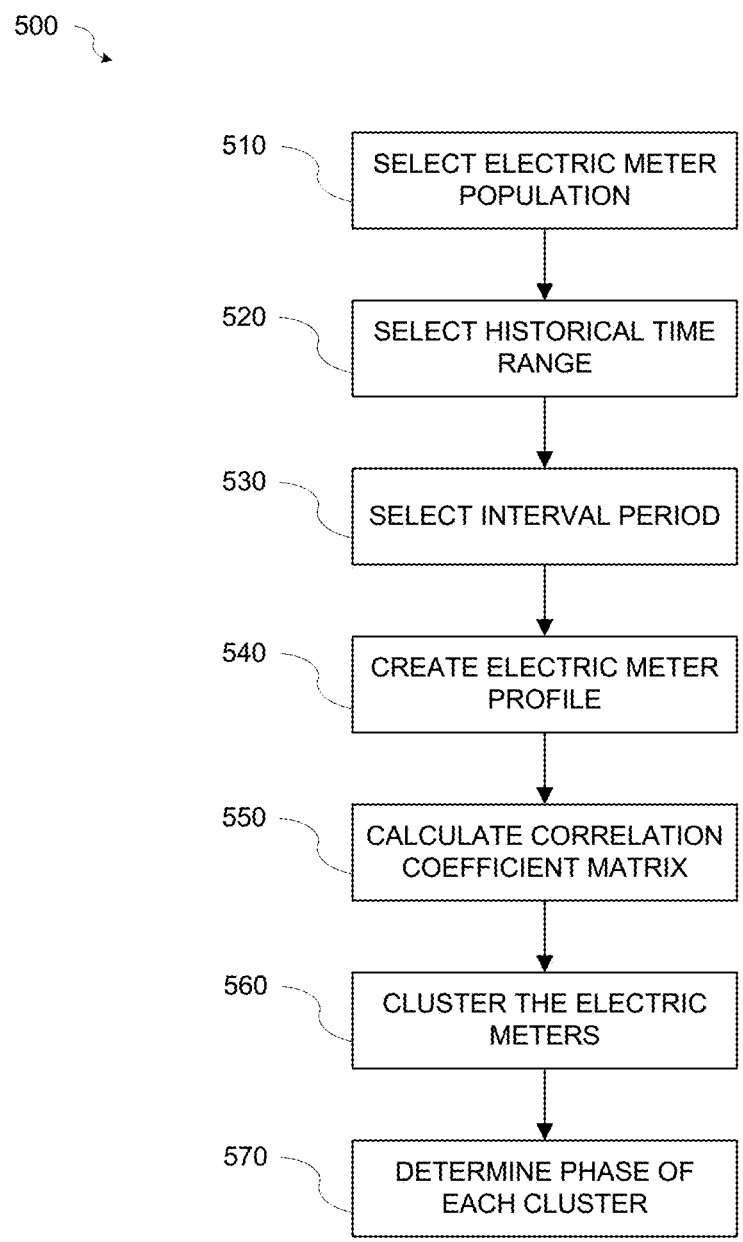
FIG. 5 is a flowchart illustrating a method for determining electric meter phase according to various aspects of the present disclosure.

In accordance with various aspects of the present disclosure, a method for determining electric meter phase is provided. FIG. 5 is a flowchart illustrating a method 500 for determining electric meter phase according to various aspects of the present disclosure. Referring to FIG. 5, at block 510, an electric meter population may be selected. All electric meters in a phase fed from a common voltage source are expected to show similar voltage change patterns. Selection of the electric meter population may be based on the common voltage source. For example, a common voltage source may be a three phase transformer where many electric meters are connected to supply power to customers on different phases of the three phase power produced by the transformer. In some configurations, the common voltage source may be a feeder where the electric meters in the feeder are supplied by a common voltage source. In other configurations, the common voltage source may be a main feeder or primary lateral where the connectivity from the electric meters to the common voltage source is traceable. The relationship of the common voltage source (e.g., main feeder, primary lateral, and/or transformer bank) to the electric meter may be derived from the meter to transformer relationship or from the service location relationship defined in GIS or in the customer information system.

At block 520, a historical time range may be selected. The historical time range may be selected based on the availability of time-synchronized electric meter voltage profiles obtained from the utility management system for all the electric meters in the selected population. In accordance with various aspects of the present disclosure, in order to capture voltage changes or as many electric meters as possible over a period of time, a historical time range having voltage profiles reported for a maximum number of meters in the selected population may be selected The historical time range may be a time range containing accumulated interval data received at the utility management system head-end controller from the electric meters. The electric meters may record the interval data, for example, every 15 minutes or another time period during a day and then send the interval data for multiple intervals to the utility management system head-end controller at a subsequent time.

The historical time range may be greater than a day, for example, greater than a 24-hour period or another period. In accordance with various aspects of the present disclosure, the selected historical time range may depend upon the size of the electric meter population. A longer historical time range may be selected for larger electric meter populations. For example, for an electric meter population that corresponds to electric meters connected to a distribution transformer, the historical time range may be in the range of two days to one week or another period of time. For an electric meter population corresponding to electric meters connected to a feeder (a larger number of electric meters than would be connected to a distribution transformer), the historical time range may be in the range of one week to one month or another period of time.

At block 530, an interval period for voltage measurements may be selected. The interval period may be used for correlation analysis. Selecting shorter interval periods may result in high frequency changes in interval period voltages being considered, while selecting longer interval periods may filter out high frequency changes in interval period voltages and take lower frequency changes in interval period voltages into consideration. In one example, the interval period may be in the range of 5 minutes to 2 hours or another time period. The interval period may be shorter than the historical time range.

At block 540, a profile for each electric meter may be created. For example, the profile may be created by the first processor 312 in the head-end controller 210. The first processor 312 may cause the profile for each electric meter to be stored in the database 225 in the storage device 220. In accordance with various aspects of the present disclosure, the profile may be based on voltage values. A profile based on voltage values may include a voltage value for each interval period during the historical time range for a particular electric meter. A profile based on voltage values is referred to herein as a voltage profile.

Alternatively, the profile may be based on changes in voltage values. A profile based on changes in voltage values may include a change in voltage values for each interval period during the historical time range for a particular electric meter. The change in voltage value may be determined as a change in voltage value from one interval period to the next interval period. A profile based on changes in voltage values is referred to herein as a voltage change profile.

One of ordinary skill in the art will appreciate that other ways of creating a profile are also possible and may be used to filter out smaller changes and retain only larger changes without departing from the scope of the present disclosure. Retaining only larger changes may allow the method to focus only on the larger voltage changes that may have been caused due to voltage control device operations.

At block 550, a correlation coefficient matrix may be calculated. For example, the first processor 312 in the head-end controller 210 may calculate the correlation coefficient matrix by comparing the profile of each electric meter (i.e., voltage profile or voltage change profile) with the profiles of each of the other electric meters in the selected electric meter population. For example, a correlation coefficient, for example, the Pearson correlation coefficient, may be calculated between two electric meters based on their voltage profiles or voltage change profiles to measure a degree of relationship between the two electric meters. One of ordinary skill in the art will appreciate that other measures of degree of relationship between electric meters may be calculated without departing from the scope of the present disclosure.

Let $\rho ij$ represent the correlation coefficient between electric meters i and j. FIG. 6 illustrates an example of a correlation coefficient matrix 600 according to various aspect of the present disclosure. As can be seen in FIG. 6, the low correlation coefficients for electric meter two indicate that electric meter two does not correlate with the other electric meters. The correlation coefficient matrix may be stored in the database 225 in the storage device 220. Alternatively, the correlation coefficient matrix may be calculated by another processor and transmitted to the database 225 in the storage device 220.

Other ways of calculating the correlation coefficient matrix may be used. For example, rather than using a single interval period, an average correlation coefficient may be obtained by using multiple interval periods. This allows consideration of higher frequency or lower frequency changes. One of ordinary skill in the art will appreciate that other ways of calculating the correlation coefficient matrix may be used without departing from the scope of the present disclosure.

Returning to FIG. 5, at block 560, the electric meters may be clustered. Each of the electric meter may be clustered into a plurality of clusters, for example, three clusters or another number of clusters. The number of clusters may be chosen based on number of electric phases available for the feeder. In some cases, three electric phases may be available and the electrical phases may be identified as "phase A," "phase B," or "phase C" with additional measurements available such as GIS assigned phase code and or sensor measurements.

In one example, fuzzy K-means clustering may be used. The distance between electric meters i and j may be calculated as $(1-\rho ij)$, where $\rho ij$ is the correlation coefficient between electric meters i and j. Based at least in part on the correlation coefficient, a confidence factor for an electric meter belonging to a particular cluster may be generated, for example, by the head-end controller in the utility management system. In this example, an electric meter may have a different confidence factor (i.e., a different output of the standard fuzzy K-means algorithm) for each of the three clusters.

The electric meter may be associated with the cluster where it has the highest confidence factor. The confidence factor indicates a level of confidence about the cluster allocation of an electric meter. A confidence factor threshold may be specified to determine whether or not to correct the phase code for the electric meter. In accordance with various aspects of the present disclosure, the phase code for an electric meter may be automatically corrected based on the value of the confidence factor.

The use of fuzzy clustering may enable the value of the confidence factor to be used to determine whether additional verification is warranted. For example, if the confidence factor for an electric meter with respect to one cluster meets or exceeds a specified confidence factor threshold as compared to the confidence factors that do not meet the specified confidence factor threshold for the other two clusters, then no verification may be needed. The electric meter may be tagged with the phase code of the cluster. If the confidence factors for each of the clusters are relatively close (e.g., all are below the confidence factor threshold), additional verification may be used to verify the correct cluster for the electric meter. For example, field verification may be performed to determine the phase of the electric meter.

While the above example is described in terms of three clusters, one of ordinary skill in the art will appreciate that any number of clusters may be used without departing from the scope of the present disclosure.

One of ordinary skill in the art will appreciate that other ways of measuring the distance between electric meters may also be used including, but not limited to, Euclidean distance. Other types of clustering may also be used, including non-fuzzy clustering. For non-fuzzy clustering, each electric meter may be placed in only one cluster.

At block 570, the phase of each cluster may be determined. The electric meter with the highest confidence factor in a cluster may be selected and its profile (i.e., voltage profile or voltage change profile) may be compared to the profiles for each phase of an upstream sensor. An upstream sensor is a measurement device connected upstream in the distribution network to the electric meters, for example, close to. One of ordinary skill in the art will appreciate that other upstream measurement devices may be used without departing from the scope of the present disclosure. The sensor may have its phase code labeled and the phase code information of the sensor may be maintained by the utility company. The voltage profiles for each of the phases of the sensor may be correlated with the voltage profile the electric meter having the highest confidence factor in each cluster. Based on the correlation of the voltage profiles, a same phase code may be assigned to each electric meter in the cluster.

The comparison of the profile of the electric meter and the profiles of the sensor may use correlation analysis. Based on the comparison, the cluster is determined to be associated with one of the phases.

Once the phase of each cluster is known, then the phase of the electric meters may be determined. If fuzzy clustering was used, then the phase of the electric meters with their highest confidence factors in a cluster may be determined to be the phase of that cluster. If non-fuzzy clustering was used, then the phase of the electric meters in a cluster is determined to be the phase of that cluster.

If there are no profiles for an upstream sensor or no upstream sensor, then other ways of determining the phase for the clusters may be used. For example, the voltage on each phase may be changed separately and an electric meter voltage correlation analysis performed to derive the phase code of the electric meters in a cluster; field verification may be performed to verify that phase of the electric meter having the highest confidence factor in the cluster is the same as the phase of the feeder voltage source; zero-crossings for both the voltage source and the electric meters in a cluster may be compared; review historical single phase power outages and identify affected clusters of electric meters. One of ordinary skill in the art will appreciate that other ways to determine phases for clusters of electric meters may be used without departing from the scope of the present disclosure.

The method in accordance with the present disclosure uses interval voltage measurements since they are a more direct indicator of overall change in grid stability. One benefit of using interval voltage measurements instead of interval energy and power measurements is that energy and power measurements tend to indicate local consumption habits rather than distribution system conditions. In other words, consumption (i.e., energy and/or power) is driven more by the load at the customer premises, whereas voltage is driven more by the connections used to distribute electricity.

The method 500 may be embodied on a non-transitory computer readable medium, for example, but not limited to, a memory or other non-transitory computer readable medium known to those of skill in the art, having stored therein a program including computer executable instructions for making a processor, computer, or other programmable device execute the operations of the methods.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. A method for determining a phase of an electric meter, the method comprising:
   selecting a population of electric meters;
   selecting a historical time range based at least in part on the selected population of electric meters;
   selecting an interval period;
   creating profiles for each electric meter in the selected population of electric meters based on voltage measurements over one or more interval periods;
   calculating a correlation coefficient matrix based on the profiles;
   clustering the selected population of electric meters into a plurality of clusters; and
   determining a phase of each cluster of the plurality of clusters based on the calculating of the correlation coefficient matrix.

2. The method of claim 1, wherein the population of electric meters is selected as a plurality of electric meters connected to a common voltage source.

3. The method of claim 2, wherein the common voltage source is a specified distribution transformer.

4. The method of claim 2, wherein the common voltage source is a specified feeder circuit.

5. The method of claim 1, wherein the profiles created for each electric meter are voltage profiles.

6. The method of claim 1, wherein the profiles created for each electric meter are voltage change profiles.

7. The method of claim 1, wherein the clustering comprises associating each electric meter with more than one cluster.

8. The method of claim 7, further comprising:
   calculating confidence factors for each electric meter in the selected population of electric meters,
   wherein the confidence factors indicate a level of confidence that an electric meter belongs in each cluster with which it is associated.

9. The method of claim 8, further comprising determining one cluster of the plurality of clusters for which each electric meter has a highest confidence factor, and
   allocating each electric meter to the cluster for which the electric meter has the highest confidence factor.

10. The method of claim 9, further comprising:
    determining a phase code of an electric meter having a highest confidence factor in the cluster; and
    assigning the phase code to each electric meter allocated to the cluster.

11. A system for determining a phase of an electric meter, the system comprising:
    an electric meter;
    a storage device; and
    a head-end controller configured to communicate with the storage device and the electric meter, wherein the head-end controller is configured to:
    select a population of electric meters;
    select a historical time range based at least in part on the selected population of electric meters;
    select an interval period;
    measure voltage during a plurality of interval periods for each electric meter in the selected population of electric meters;

create profiles for each electric meter in the selected population of electric meters based on the voltage measurements over one or more interval periods;

calculate a correlation coefficient matrix based on the profiles;

cluster the selected population of electric meters into a plurality of clusters; and determine a phase of each cluster of the plurality of clusters based on calculating the correlation coefficient matrix.

12. The system of claim 11, wherein the head-end controller is configured to select the population of electric meters as a plurality of electric meters connected to a common voltage source.

13. The system of claim 12, wherein the head-end controller is configured to select the population of electric meters as a plurality of electric meters connected to a specified distribution transformer as a common voltage source.

14. The system of claim 12, wherein the head-end controller is configured to select the population of electric meters as a plurality of electric meters connected to a specified feeder circuit as a common voltage source.

15. The system of claim 11, wherein the profiles created for each electric meter are voltage profiles.

16. The system of claim 11, wherein the profiles created for each electric meter are voltage change profiles.

17. The system of claim 11, wherein the head-end controller is configured to associate each electric meter with more than one cluster.

18. The system of claim 17, wherein the head-end controller is configured to calculate confidence factors for each electric meter in the selected population of electric meters, wherein the confidence factors indicate a level of confidence that an electric meter belongs in each cluster with which it is associated.

19. The system of claim 18, wherein the head-end controller is configured to:

determine one cluster of the plurality of clusters for which each electric meter has a highest confidence factor, and allocate each electric meter to the cluster for which the electric meter has the highest confidence factor.

20. The system of claim 19, wherein the head-end controller is configured to:

determine a phase code of an electric meter having the highest confidence factor in the cluster; and assign the phase code to each electric meter allocated to the cluster.

* * * * *